(12) United States Patent
Ohno et al.

(10) Patent No.: US 6,717,183 B2
(45) Date of Patent: Apr. 6, 2004

(54) LIGHT-EMITTING THYRISTOR MATRIX ARRAY AND DRIVER CIRCUIT

(75) Inventors: Seiji Ohno, Osaka (JP); Yukihisa Kusuda, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/937,194

(22) PCT Filed: Jan. 31, 2001

(86) PCT No.: PCT/JP01/00623

§ 371 (c)(1),
(2), (4) Date: Sep. 21, 2001

(87) PCT Pub. No.: WO01/57935

PCT Pub. Date: Aug. 9, 2001

(65) Prior Publication Data

US 2003/0071274 A1 Apr. 17, 2003

(30) Foreign Application Priority Data

Jan. 31, 2000 (JP) .......................................... 2000-21458

(51) Int. Cl.[7] .............................. H01L 33/00; G09G 3/32
(52) U.S. Cl. ............................ 257/88; 257/79; 345/82
(58) Field of Search .................. 257/79–103, 431–433; 345/44–46, 82

(56) References Cited

U.S. PATENT DOCUMENTS

| 4,394,653 A | * | 7/1983 | Breeze | 340/802 |
| 5,763,909 A | * | 6/1998 | Mead et al. | 257/291 |
| 2002/0153532 A1 | * | 10/2002 | Sonobe et al. | 257/150 |

FOREIGN PATENT DOCUMENTS

| JP | 359117280 A | * | 7/1984 | H01L/33/00 |
| JP | 3-194978 | | 8/1991 | |
| JP | 403194978 A | * | 8/1991 | H01L/33/00 |
| JP | 9-150543 | | 6/1997 | |
| JP | 9-216416 | | 8/1997 | |
| JP | 9-283792 | | 10/1997 | |

OTHER PUBLICATIONS

PCT Search Report, May, 1, 2001.

* cited by examiner

*Primary Examiner*—Nathan J. Flynn
*Assistant Examiner*—Johannes P. Mondt
(74) *Attorney, Agent, or Firm*—RatnerPrestia (57) ABSTRACT

A light-emitting thyristor matrix array in which the area of a chip may be decreased is provided. A plurality of three-terminal light-emitting thyristors are arrayed in one line in parallel with the long side of the chip, a plurality of bonding pads are arrayed in one line in parallel with the long side of the chip. Thereby, the area of the chip becomes smaller.

7 Claims, 13 Drawing Sheets

LIGHT-EMITTING THYRISTOR MATRIX ARRAY AND DRIVER CIRCUIT

TECHNICAL FIELD

The present invention relates to a light-emitting thyristor matrix array formed on a chip, particularly to a light-emitting thyristor matrix array in which an area of the chip may be made small. The present invention further relates to a driver circuit for the array.

BACKGROUND ART

In an light-emitting element array used in a writing head of an optical printer, it is essentially required to derive the same number of lines from light-emitting elements as that of light-emitting elements. A wire bonding method is generally used for the derivation of lines. Therefore, the following problems are caused as the density of light-emitting elements is increased.

(1) A product cost becomes larger due to the increase of an area of a wire bonding pad on a light-emitting element array chip, i.e. an area of the chip.
(2) A production cost becomes larger due to the increase of the number of wire bondings.
(3) A production becomes difficult as the pitch of wire bonding becomes smaller.
(4) A product cost is increased because driver circuits, the number thereof is equal to that of light-emitting elements, are generally required.

An area of one bonding pad is several times or more compared with an area of one light-emitting element, so that the increase of light-emitting elements density leads to the increase of chip area.

In order to avoid these problems, a light-emitting diode (LED) array matrix array, a light-emitting thyristor matrix array, and so on have been proposed.

Figure 1:
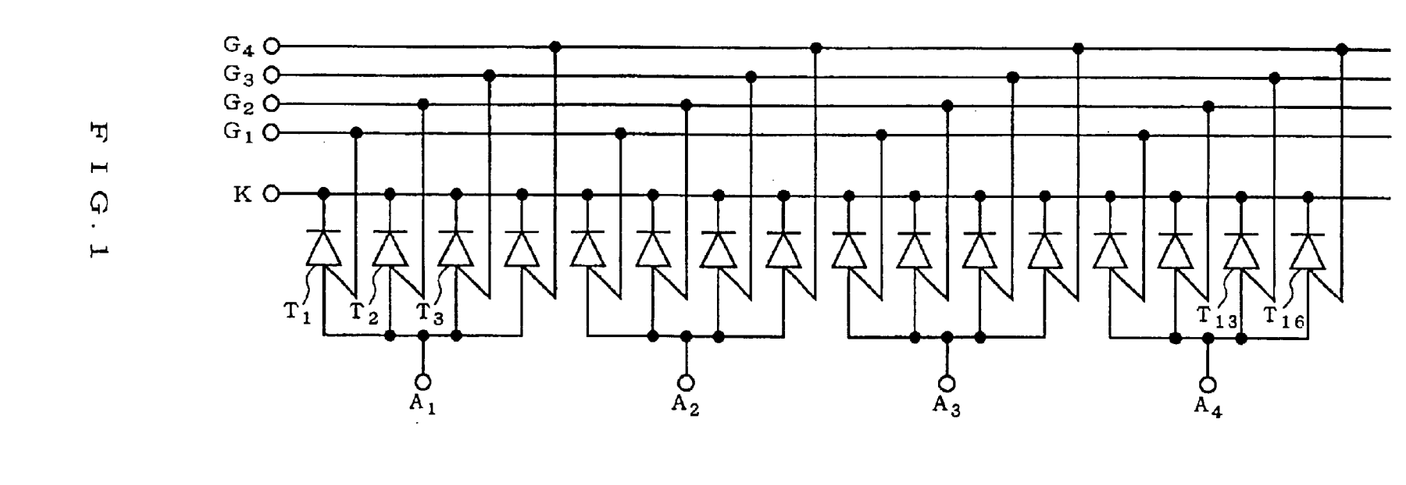
FIG. 1 is a diagram illustrating a conventional light-emitting thyristor matrix array.

FIG. 1 shows an example of the light-emitting thyristor matrix array. According to this matrix array, a plurality of three-terminal light-emitting thyristors $T_1, T_2, T_3, \ldots$ are arrayed in one line. These thyristors are divided into groups four by four. Anodes of the thyristors in each group are commonly connected to anode terminals $A_1, A_2, A_3, \ldots$, respectively, gates of the thyristors in each group are separately connected to gate-selecting lines $G_1$–$G_4$, and cathodes of all the thyristors are commonly connected to a cathode line K.

The lighting up of thyristors $T_1, T_2, T_3, \ldots$ is determined by a combination of voltage levels of the gate-selecting lines $G_1$–$G_4$ and voltage levels of the anode terminals $A_1, A_2, A_3,\ldots$. As this matrix array is a type of cathode common, when the cathode line K is at L level and an anode terminal $A_i$ is at H level while one gate-selecting line $G_j$ being at L level and the others H level, a light-emitting thyristor $T_{j+4(i-1)}$ is lighted up.

In a conventional light-emitting element array in which N (N is an integer≧2) light-emitting elements are arrayed, N control terminals are required to be derived in order to control N light-emitting elements. On the contrary, the number of control terminals is (N/M+M) in the light-emitting thyristor matrix array including M (M is an integer≧2) gate-selecting lines. The number of the thyristors which may be lighted up at the same time is equal to that of the anode terminals in the light-emitting thyristor matrix array. Also, the light emission duty ratio is equal to 1/M. Assuming that N is equal to 128 in the array of FIG. 1, the number of the anode terminals is equal to 32 since the number of the gate-selecting lines is 4.

Using the light-emitting thyristor matrix array, the number of bonding pads on a matrix array chip may be decreased. The number M of the gate-selecting lines in this structure in which the number of bonding pads may be decreased is selected in such a manner that M is an integer near to $N^{1/2}$ and N/M is an integer. For example, when M=8 or M=16 is selected in case of N=128, the number of bonding pads is 24 and this is minimum value. Therefore, it is possible to make the chip area small, resulting in the decrease of the chip cost. The circuit structure in FIG. 1 using light-emitting thyristors has been proposed by the present applicant, and Japanese Patent has already been issued (Japanese Patent No. 2807910).

While the number of bonding pads may be decreased to the minimum value as described above, the chip area is not guaranteed to be minimum. A matrix array chip is generally sliced in parallelogram (e.g., rectangle). The length of a long side of the chip is determined by the product of the array pitch and the number of the light-emitting thyristors, and the length of a short side is principally determined by the summation of the width of one light-emitting thyristor, the width of wirings and the width bonding pads. The area required for one bonding pad is decided by the performance of a wire bonding machine, so that it is impossible for the length of a short side of the chip to be short, unless the number of rows of bonding pads is reduced. Therefore, the area of the chip is not decreased, even if the number of bonding pads is reduced.

DISCLOSURE OF THE INVENTION

The object of the present invention is to provide a light-emitting thyristor matrix array in which the area of a chip may be decreased.

In order to decrease the area of the chip, bonding pads are arrayed in one line parallel to a long side of the chip to make the length of a short side of the chip small. The bonding pads may be arrayed in one line by increasing the number M of gate-selecting lines to decrease the number of bonding pads. However, if the number of the gate-selecting lines is increased, then the length of a short side of the chip is increased because the gate-selecting lines are elongated end to end of the chip and in parallel with the long side of the chip. Therefore, it is required that the number of gate-selecting lines is determined so that the bonding pads may be arrayed in one line and the number M of the gate-selecting lines becomes as small as possible.

In a light-emitting thyristor matrix array comprising N (N is an integer≧2) three-terminal light-emitting thyristors arrayed in one line, cathodes or anodes of the N light-emitting thyristors are connected to a common terminal, M (M is an integer≧2) gate-selecting lines are provided, the gate of kth light-emitting thyristor is connected to ith [i={(k−1) MOD M}+1] gate-selecting line $G_i$, wherein "(k−1)MOD M" means a remainder when (k−1) is divided by M, and the anode or cathode (which is not connected to the common terminal) of the kth light-emitting thyristor is connected to jth [j={(k−i)/M}+1] anode terminal $A_j$ or cathode terminal $K_j$.

In this case, the number M of the gate-selecting lines is selected so as to satisfy the relationship of L/{(N/M)+M}>p, wherein "L" is a length of the long side of the chip, and "p" is a critical value of array pitch of the bonding pads. The value of "p" may be small when a high accuracy wire bonding machine is used, but too small value make an operation time longer. Therefore, the value of "p" is practically around 75 μm.

According to the present invention, the anodes or cathodes may be connected to selecting lines. In this case, cathodes or anodes of the N light-emitting thyristors are connected to a common terminal, M (M is an integer≧2) anode-selecting lines or cathode-selecting lines are provided, the anode or cathode which is not connected to the common terminal of the kth light-emitting thyristor is connected to ith [i={(k−1)MOD M}+1] anode-selecting line $A_i$ or cathode-selecting lines $K_i$, and the gate of the kth light-emitting thyristor is connected to jth [j={(k−i)/M}+1] gate terminal $G_j$.

A light-emitting thyristor matrix array chip including a plurality of bonding pads arrayed in one line in parallel with the long side of the chip is positioned adjacent to a driver IC. The terminal of the light-emitting thyristor matrix array chip are connected through bonding wires directly to that of the driver IC.

In the structure such that the matrix array chip and the driver IC are connected directly by bonding wires, the array pitch of the bonding pads of the chip is to be substantially the same as that of the bonding pads of the driver IC. Consequently, as the resolution of the light-emitting thyristor matrix array is varied, different driver ICs must be prepared. Therefore, many types of driver ICs are required, resulting in an increase in product cost.

Another object of the present invention, therefore, is to provide a driver IC commonly applicable to a plurality of light-emitting thyristor matrix arrays each having a different resolution.

In case of the three-terminal light-emitting thyristor matrix array, the bonding pads may be arrayed in one line by selecting the number of the gate-selecting lines to decrease the number of the bonding pads, as described above. Accordingly, when the number of the gate-selecting lines is decided for some resolution of the matrix array, the number of the anode terminals is determined. If the resolution is desired to be increased by a factor of two, then a light-emitting thyristor matrix array chip in which only the number of gate-selecting lines is increased by two times may be prepared. Therefore, the light-emitting matrix array chip having different resolution may be driven by the same driver IC including excess gate-selecting line driving circuits without varying the number of anode terminal driving circuits that must supply a large current. As a result, the number of types of driver IC to be prepared may be decreased to down the product cost.

BEST MODE FOR CARRYING OUT THE INVENTION

A preferred embodiment of a light-emitting thyristor matrix array according to the present invention will now be described with reference to the drawings.

Embodiment 1

Figure 2:
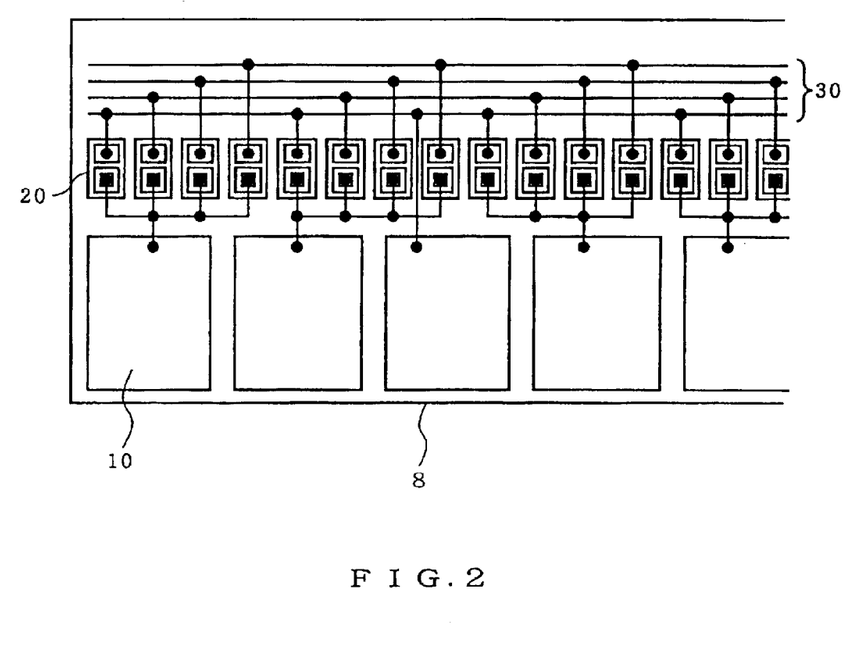
FIG. 2 is a diagram illustrating a chip of an embodiment of the light-emitting thyristor matrix array according to the present invention.
Figure 3A:
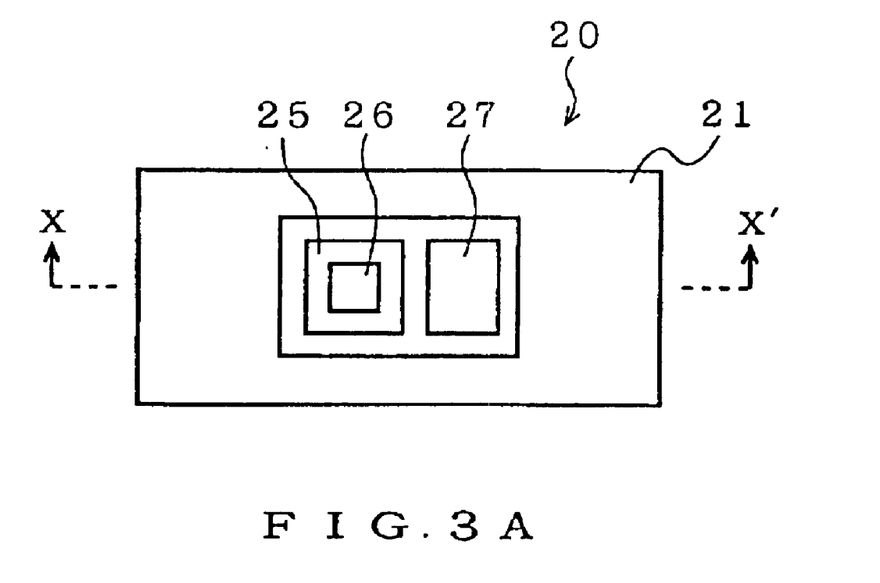
FIGS. 3A and 3B are diagrams illustrating the structure of a light-emitting thyristor.
Figure 3B:
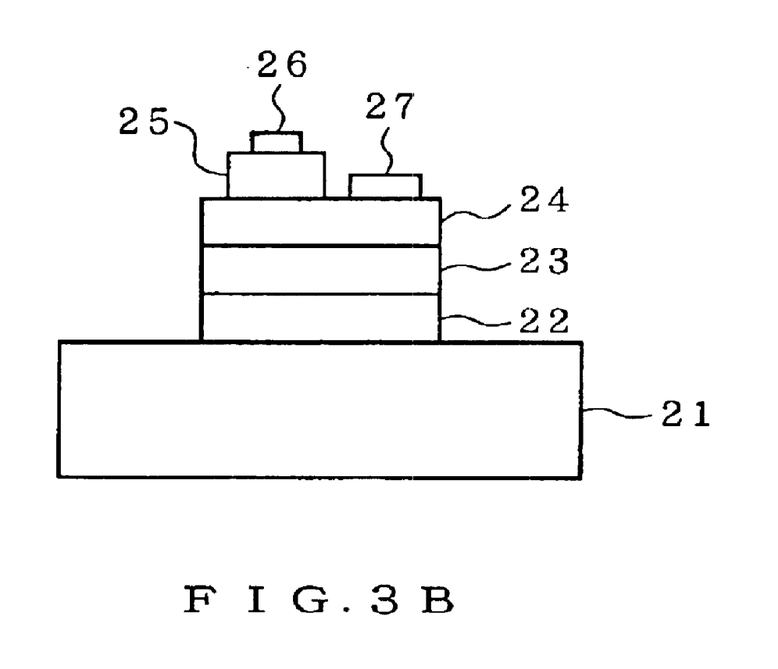

Referring to FIG. 2, there is shown a chip of an embodiment of a light-emitting thyristor matrix array. FIGS. 3A and 3B show a structure of a light-emitting thyristor used in this matrix array.

The structure of a light-emitting thyristor will now be described with reference to FIGS. 3A and 3B. FIG. 3A is a plan view and FIG. 3B a cross-sectional view taken along the X–X' line in FIG. 3A. A light-emitting thyristor 20 has a structure such that an n-type semiconductor layer 22, a p-type semiconductor layer 23, an n-type semiconductor layer 24, a p-type semiconductor layer 25 are stacked in turn on an n-type semiconductor substrate 21, an anode electrode 26 is formed on the p-type semiconductor layer 25, and a gate electrode 27 is formed on the n-type semiconductor layer 24. A cathode electrode (not shown) is formed on the bottom side of the n-type semiconductor substrate 21.

A light-emitting thyristor matrix array chip 8 shown in FIG. 2 has a structure such that 128 light-emitting thyristor 20 are arrayed in one line in 600 dpi (dots per inch), bonding pad 10 are arrayed in one line parallel to the array of thyristors, and a plurality of gate-selecting lines are arrayed in parallel with the array of thyristors.

75 μm or more is required for the array pitch of bonding pads 10 due to the capability of a wire bonding machine. The width of the bonding pad 10 in a direction of the short side of the chip is 150 μm. Also, the width of one gate-selecting line 30 is 15 μm.

Figure 4:
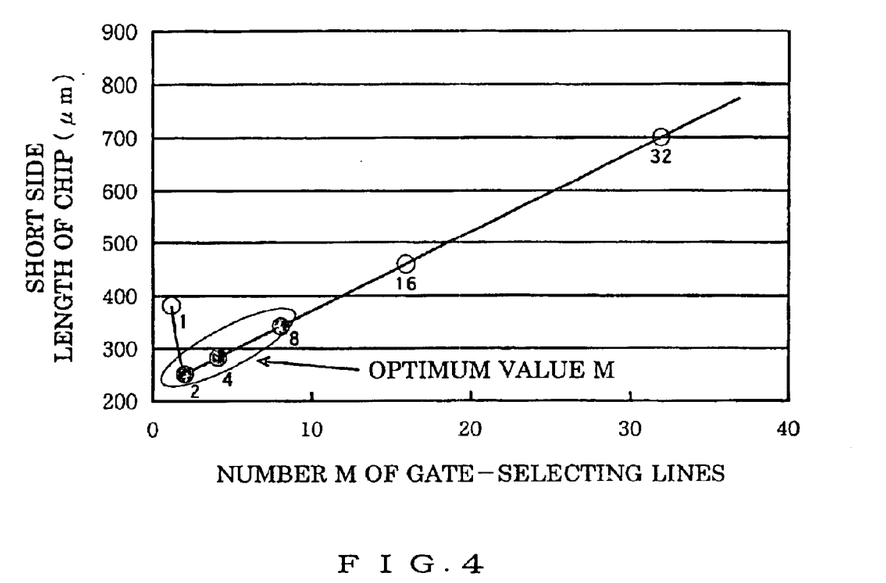
FIG. 4 is a graph showing the calculated length of a short side of the chip when the number M of gate-selecting lines is varied in the light-emitting thyristor matrix array having 128 light-emitting points of 600 dpi.

In the chip structure described above, the length of a short side of the chip is calculated when the number of gate-selecting lines is changed. The calculated result is shown in a graph of FIG. 4. M is an integer by which 128 may be divided, so that M is selected from a group of 1, 2, 4, 8, 16, 32, 64, 128. It is recognized from the graph of FIG. 4 that a short side length of the chip is minimum at M=2. However, in the case of M=2, the array pitch of bonding pads is about 80 μm which is near to the critical value p, so that a high performance bonding is required. In the case of M=4 or 8, the number of bonding pads is decreased compared with the case of M=2, as a result the array pitch of bonding pads may be increased. Therefore, it is preferable to select the value M within 4 and 8.

Embodiment 2

Figure 5:
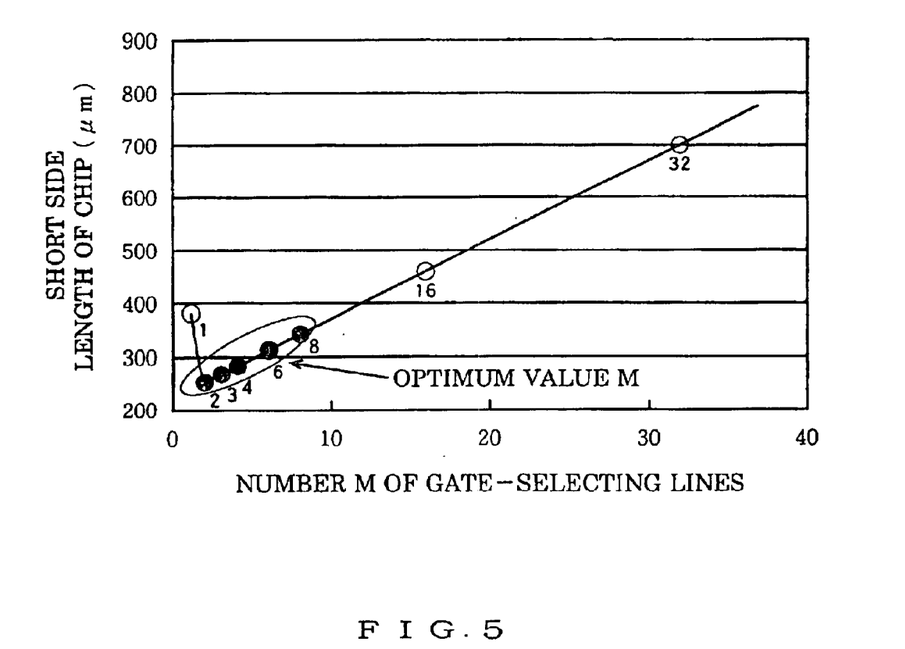
FIG. 5 is a graph showing the calculated length of a short side of the chip when the number M of gate-selecting lines is varied in the light-emitting thyristor matrix array having 192 light-emitting points of 600 dpi.

A light-emitting thyristor matrix array having 192 light-emitting points of 600 dpi will now be considered. FIG. 5 shows a graph of the calculated result of a short side length of the chip when the number of gate-selecting lines is changed as in the embodiment 1. In this matrix array, the number of the value M by which 192 may be divided is increased because 192 is expressed as $192=2^6 \times 3$ and then includes a prime factor of 3. Consequently, M may be selected from a group of 1, 2, 3, 4, 6, 8, 12, 16, 24, 32, 48, 64, 96, and 192. The short side length of the chip is minimum at M=2. However, when the value of M becomes larger, there is a merit in that the array pitch of the bonding pads becomes larger, so that the range capable of selecting the value of M is expanded to the condition of $\leq 8$ as in the embodiment 1. That is, it is recognized that the value of M is preferably selected from a group of 3, 4, 6, and 8.

Embodiment 3

Figure 6:
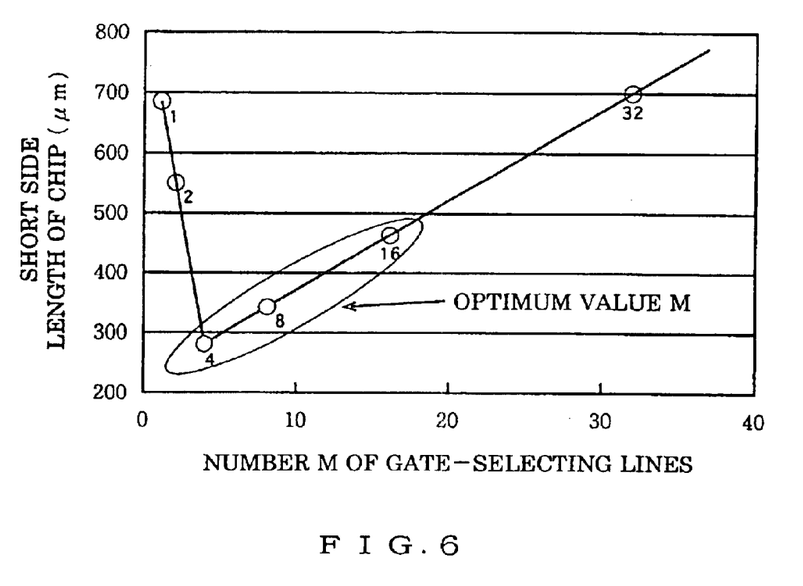
FIG. 6 is a graph showing the calculated length of a short side of the chip when the number M of gate-selecting lines is varied in the light-emitting thyristor matrix array having 256 light-emitting points of 1200 dpi.

A light-emitting thyristor matrix array having 256 light-emitting points of 1200 dpi will now be considered. FIG. 6 shows a graph of the calculated result of a short side length of the chip when the number of gate-selecting lines is changed as the embodiment 1. It is recognized from the graph of FIG. 6 that M is preferably selected from a group of 4, 8 and 16.

Embodiment 4

Figure 7:
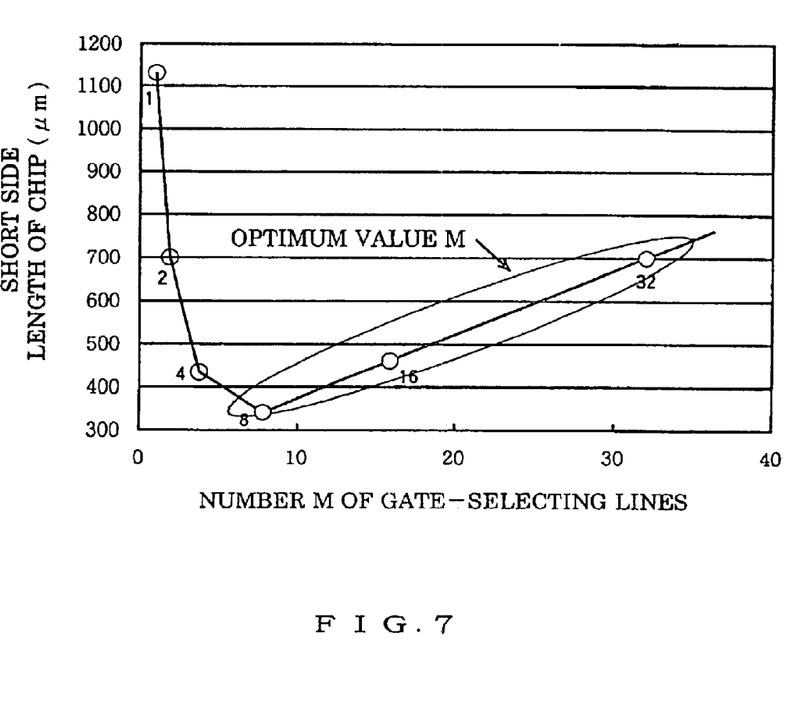
FIG. 7 is a graph showing the calculated length of a short side of the chip when the number M of gate-selecting lines is varied in the light-emitting thyristor matrix array having 512 light-emitting points of 2400 dpi.

A light-emitting thyristor matrix array having 512 light-emitting points of 2400 dpi will now be considered. FIG. 7 shows a graph of the calculated result of a short side length of the chip when the number of gate-selecting lines is changed as the embodiment 1. It is recognized from the graph of FIG. 7 that M is preferably selected from a group of 8, 16 and 32.

Embodiment 5

Figure 8:
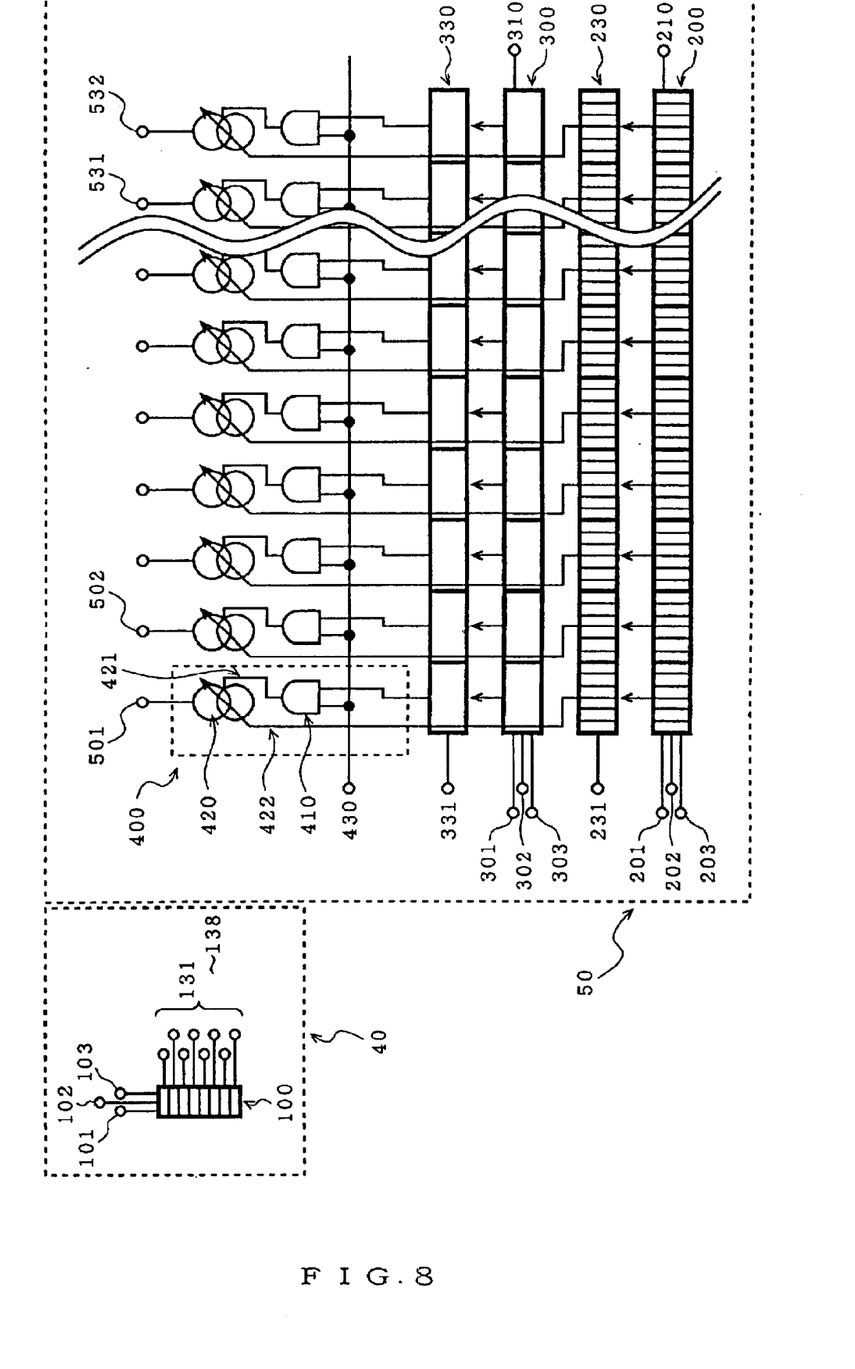
FIG. 8 is a diagram illustrating an example of a driver IC.

A driver circuit (IC; Integrated Circuit) for the matrix array including 32×n (n=4, 6 or 8) light-emitting points will now be considered. FIG. 8 shows a driver IC commonly applicable to three types of light-emitting thyristor matrix array chip of 128 light-emitting points/600 dpi/4 gate-selecting lines, 192 light-emitting points/900 dpi/6 gate-selecting lines, and 256 light-emitting points/1200 dpi/8 gate-selecting lines.

The driver IC consists of a gate-selecting line driving circuit 40 and an anode terminal driving circuit 50. The gate-selecting line driving circuit 40 is comprised of a 8 bit serial input/parallel output shift register 100. Reference numerals 131–138 designate gate-selecting signal output terminals which are connected to the bonding pads for the gate-selecting lines $G_1$–$G_n$.

After resetting the shift register 100 (all bits are set to High level) a reset terminal 102, an input terminal 101 is set to Low level and a clock is supplied to a terminal 103 in order to shift in turn the state of L level to cause the output terminals 131–138 L level in turn. When the ith gate-selecting line $G_i$ is at L level, thyristors connected to the line $G_i$ are possible to be lighted up. In this manner, the output terminal 131–138 outputs a "selecting" signal at one output terminal and "no-selecting" signals at other output terminals in order to select one gate-selecting line.

The number of gate-selecting lines is n in the light-emitting thyristor matrix array having 32×n (n=4, 6, or 8) light-emitting points, so that the gate-selecting line $G_1$ is required to be caused L level after the gate-selecting line $G_n$ is caused to be L level. Therefore, the input terminal 101 is again caused L level at a next timing after the gate-selecting line $G_n$ is made L level, and a clock is supplied to the terminal 103 to cause the gate-selecting line $G_1$ L level.

The anode terminal driving circuit 50 may drive 32 light-emitting points at the same time. The light output of the light-emitting thyristors may be regulated by current sources 420 of current driving circuits 400. The value of current output from the current sources 420 may be controlled by a current value data (6 bits) input supplied to input terminals 422, and currents are output from terminals 501–532 based on the state of current output permitting terminals 421.

A serial signal supplied to a data input terminal 201 is divided into 32 sets of 6 bits data to generate a current value data by a shift register 200 having a reset terminal 202 and a clock terminal 203. The current value data is held in a latch 230 having a latch terminal 231 and then input to the current value data input terminal 422. The shift register 200 comprises a data output terminal 210 which may be connected to a data input terminal 201 of an adjacent driver IC. As a result, the number of current data line in an optical writing head may be decreased.

A serial signal supplied to a data input terminal 301 is divided into 32 sets of 1 bit data to generate an image data by a shift register 300 having a reset terminal 302 and a clock terminal 303. The image data is held by a latch 330 having a latch terminal 331 and then input to one input terminal of an AND gate 401, to the other input terminal thereof a light emission permitting terminal 430 is connected. The output terminal of the AND gate 410 constitutes said current output permitting terminal 421. The shift register 300 comprises a data output terminal 310 which may be connected to a data input terminal 301 of an adjacent driver IC. As a result, the number of image data lines in the optical writing head may be decreased.

Figure 9:
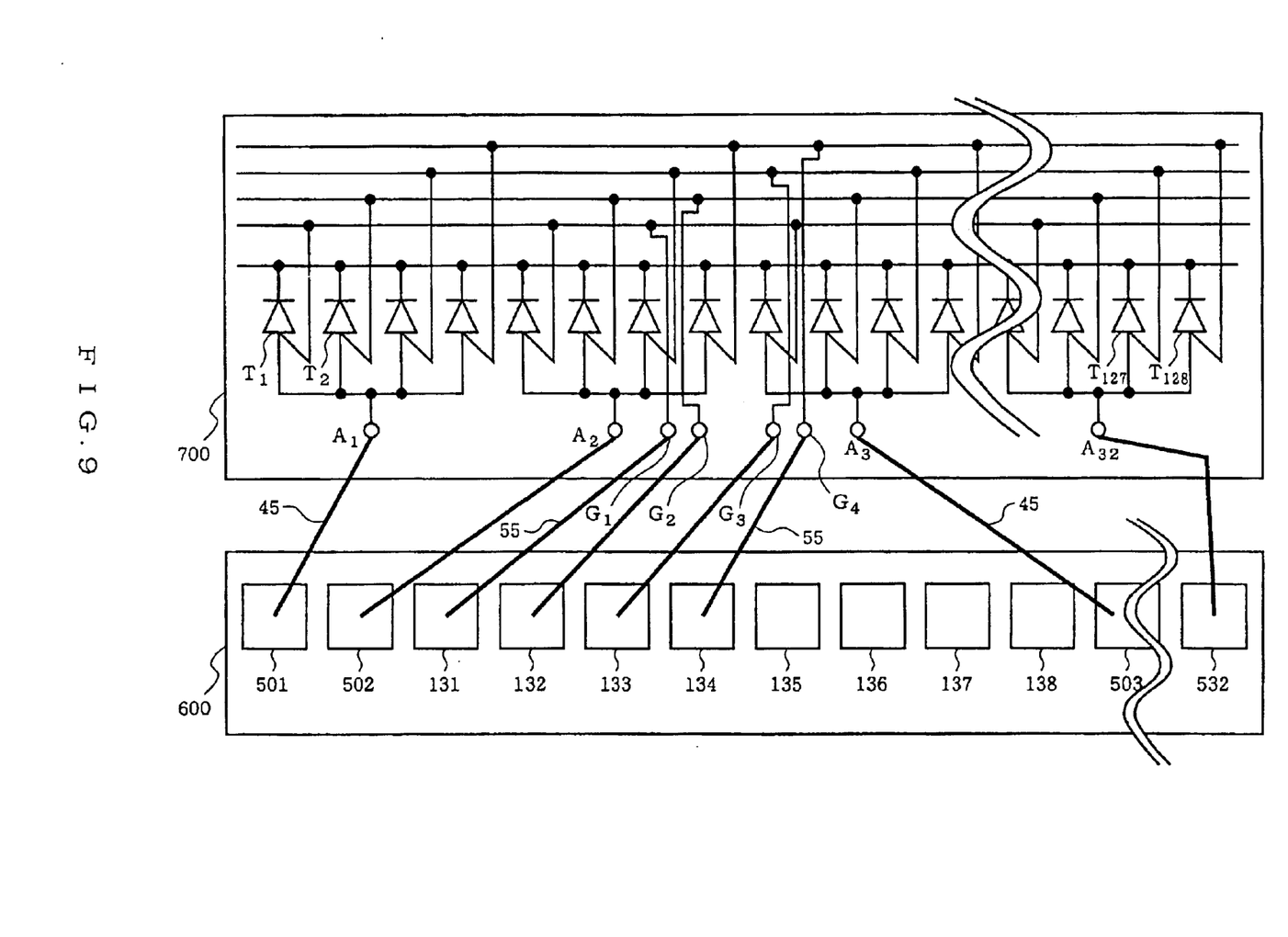
FIG. 9 is a diagram illustrating an example of connection between the light-emitting thyristor matrix array of 128 light-emitting points/600 dpi/4 gate-selecting lines and the driver IC by bonding wires.

FIG. 9 shows an example in which an driver IC 600 having the structure described above is connected through bonding wires to a light-emitting thyristor matrix array chip 700 of 128 light-emitting point/600 dpi/4 gate-selecting lines. The output terminals 501, 502, 503, . . . , and 532 of the anode terminal driving circuit 50 of the drive IC 600 are connected to anode terminals $A_1$, $A_2$, . . . , and $A_{32}$ of the matrix array chip 700 by bonding wires 45 respectively, and the output terminals 131, 132, 133 and 134 of the gate-selecting line driving circuit 40 of the driver IC 600 are connected to gate-selecting terminals $G_1$, $G_2$, $G_3$, and $G_4$ of the chip 700 by bonding wires 55 respectively.

Figure 10:
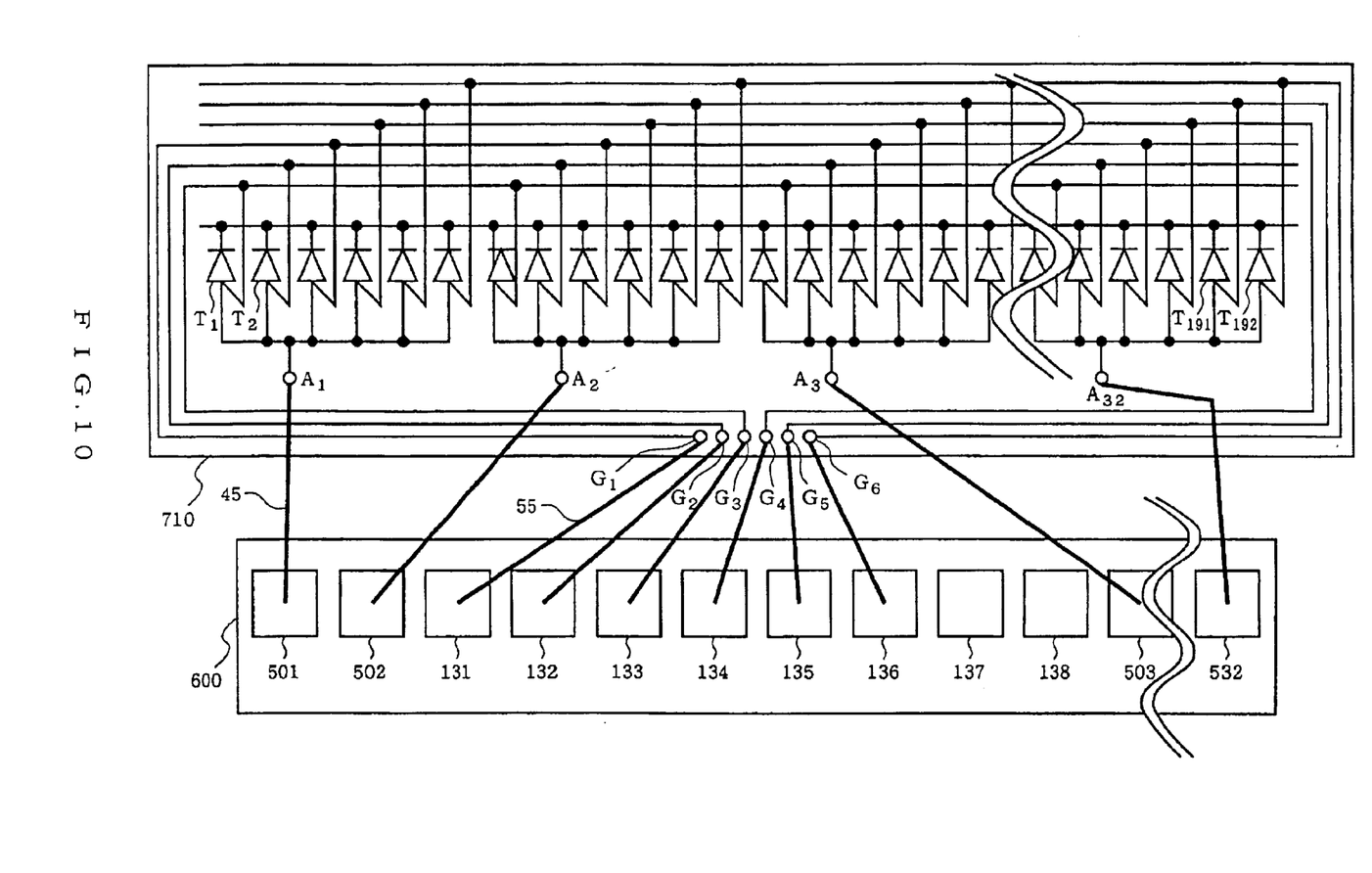
FIG. 10 is a diagram illustrating an example of connection between the light-emitting thyristor matrix array of 192 light-emitting points/900 dpi/6 gate-selecting lines and the driver IC by bonding wires.

FIG. 10 shows an example in which the driver IC 600 described above is connected through bonding wires to a light-emitting thyristor matrix array chip 710 of 192 light-emitting points/900 dpi/6 gate-selecting lines. The output terminals 501, 502, 503, . . . , and 532 of the drive IC 600 are connected to the anode terminals $A_1, A_2, \ldots,$ and $A_{32}$ of the matrix array chip 710 by bonding wires 45 respectively, and the output terminals 131, 132, 133, 134, 135, and 136 are connected to gate-selecting terminals $G_1, G_2, G_3, G_4, G_5,$ and $G_6$ of the chip 710 by bonding wires 55 respectively.

Figure 11:
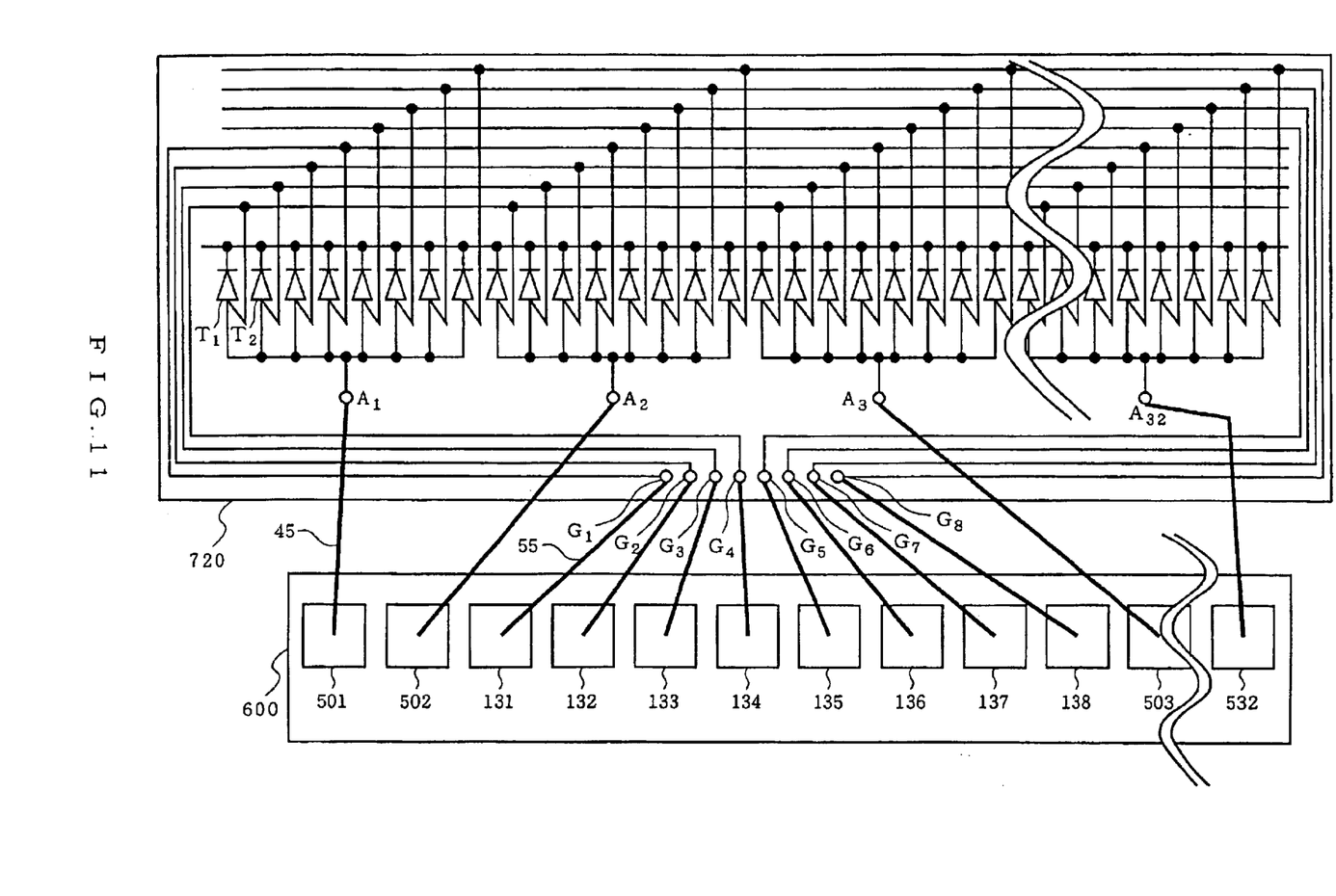
FIG. 11 is a diagram illustrating an example of connection between the light-emitting thyristor matrix array of 256 light-emitting points/1200 dpi/8 gate-selecting lines and the driver IC by bonding wires.

FIG. 11 shows an example in which the driver IC 600 described above is connected through bonding wires to a light-emitting thyristor matrix array chip 720 of 256 light-emitting points/1200 dpi/8 gate-selecting lines. The output terminals 501, 502, 503, . . . , and 532 of the drive IC 600 are connected to the anode terminals $A_1, A_2, \ldots,$ and $A_{32}$ of the matrix array chip 720 by bonding wires 45 respectively, and the output terminals 131, 132, 133, 134, 135, 136, 137, and 138 are connected to gate-selecting terminals $G_1, G_2, G_3, G_4, G_5, G_6, G_7,$ and $G_8$ of the chip 720 by bonding wires 55 respectively.

Embodiment 6

Figure 12:
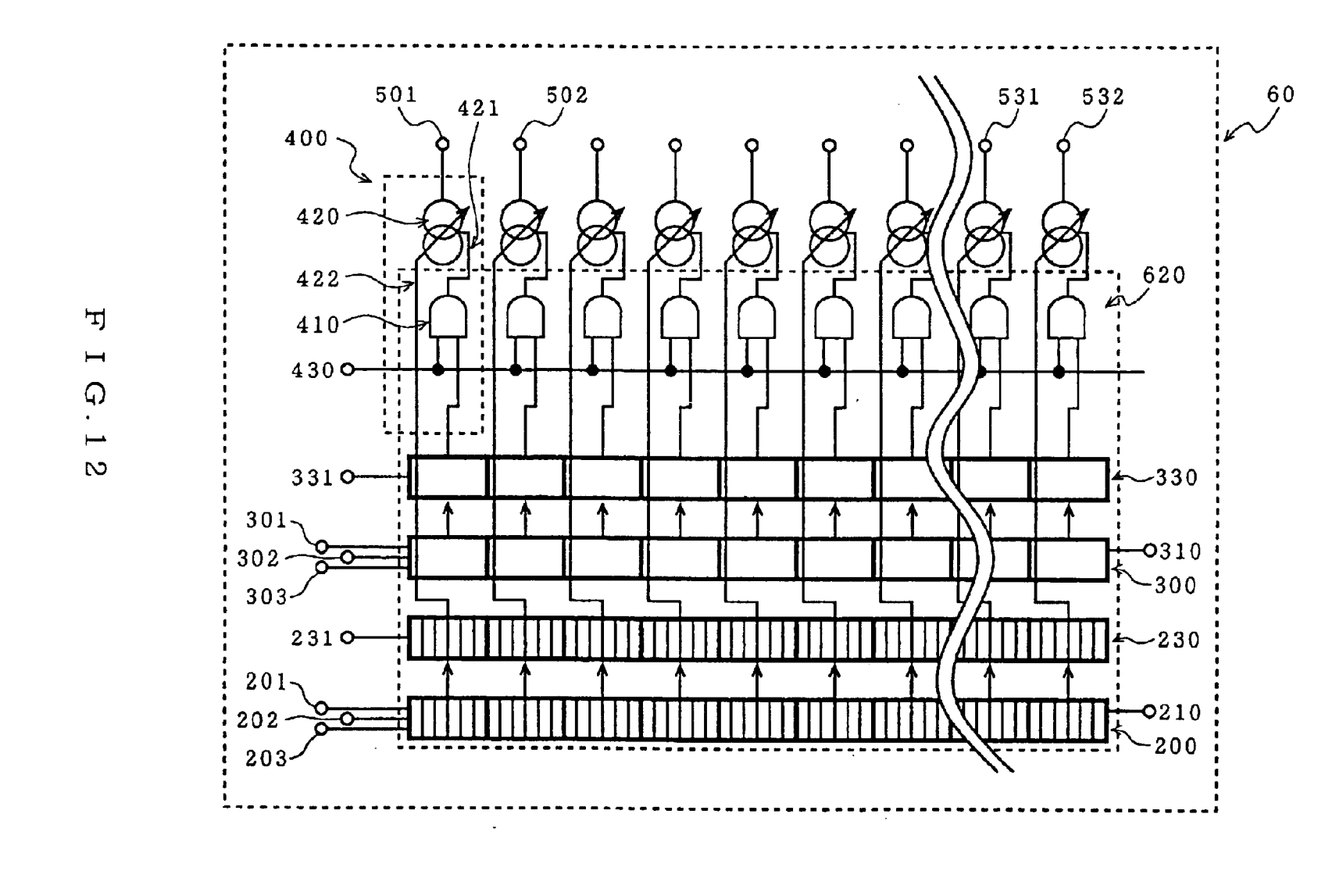
FIG. 12 is a diagram illustrating another example of a driver IC.

Another example of a driver IC for the matrix array including 32×n (n=4, 6 or 8) light-emitting points will now be considered. FIG. 12 shows a driver IC commonly applicable to three types of light-emitting thyristor matrix array chip of 128 light-emitting points/600 dpi/4 gate-selecting lines, 192 light-emitting points/900 dpi/6 gate-selecting lines, and 256 light-emitting points/1200 dpi/8 gate-selecting lines. The driver IC consists of an anode driving circuit 60, and a gate-selecting line driving circuit (not shown) is provided outside the driver IC.

The anode terminal driving circuit 60 may drive 32 light-emitting points at the same time. The light output of the light-emitting thyristors may be regulated by current sources 420 of current driving circuits 400. The value of current output from the current sources 420 may be controlled by a current value data (6 bits) input supplied to input terminals 422, and currents are output from terminals 501–532 based on the state of current output permitting terminals 421.

A serial signal supplied to a data input terminal 201 is divided into 32 sets of 6 bits data to generate a current value data by a shift register 200 having a reset terminal 202 and a clock terminal 203. The current value data is held in a latch 230 having a latch terminal 231 and then input to the current value data input terminal 422. The shift register 200 comprises a data output terminal 210 which may be connected to a data input terminal 201 of an adjacent driver IC. As a result, the number of current data line in an optical writing head may be decreased.

A serial signal supplied to a data input terminal 301 is divided into 32 sets of 1 bit data to generate an image data by a shift register 300 having a reset terminal 302 and a clock terminal 303. The image data is held by a latch 330 having a latch terminal 331 and then input to one input terminal of an AND gate 401, to the other input terminal thereof a light emission permitting terminal 430 is connected. The output terminal of the AND gate 410 constitutes said current output permitting terminal 421. The shift register 300 comprises a data output terminal 310 which may be connected to a data input terminal 301 of an adjacent driver IC. As a result, the number of image data lines in the optical writing head may be decreased.

Figure 13:
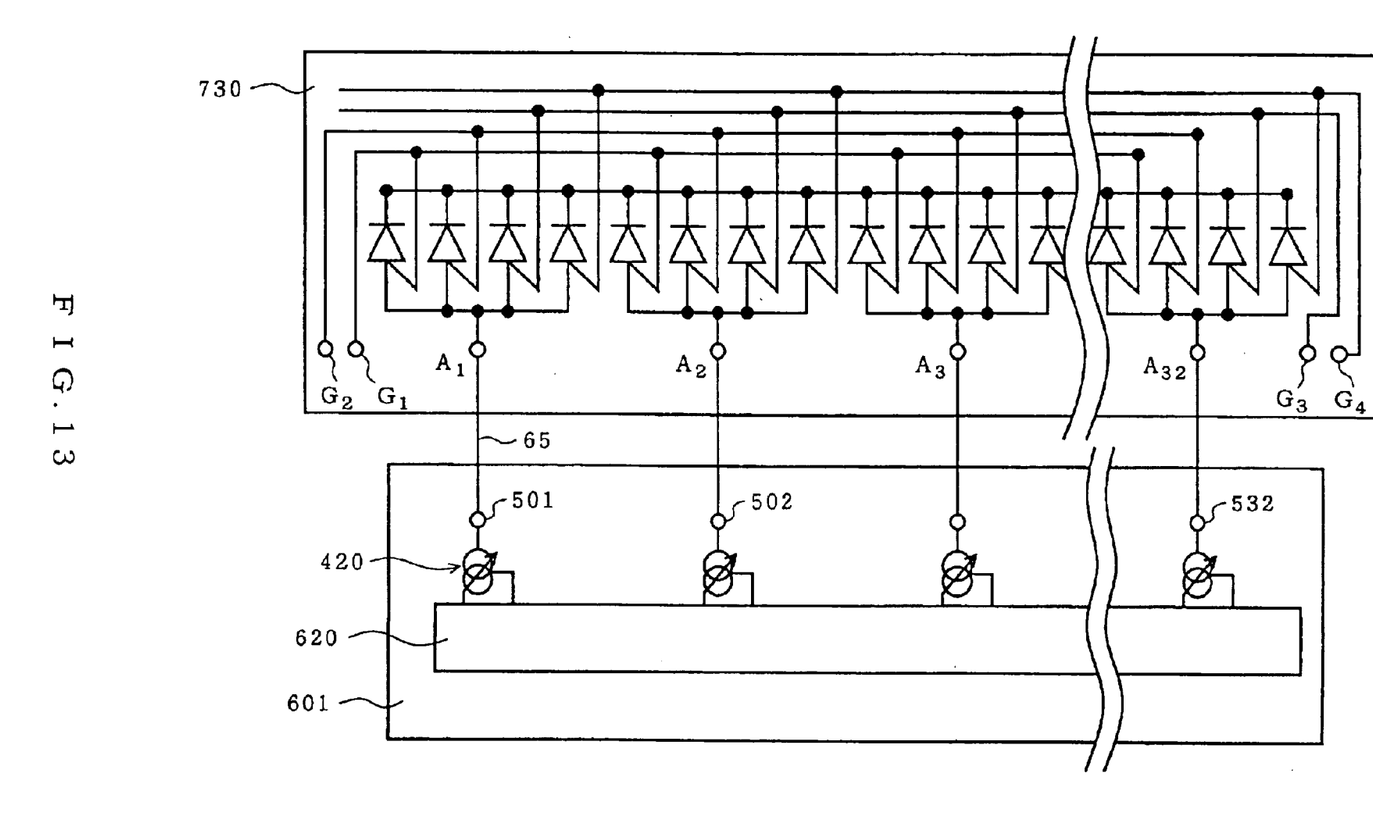
FIG. 13 is a diagram illustrating an example of connection between the light-emitting thyristor matrix array of 128 light-emitting points/600 dpi/4 gate-selecting lines and the driver IC by bonding wires.

FIG. 13 shows an example in which an driver IC 601 having the structure described above is connected to a light-emitting thyristor matrix array chip 730 of 128 light-emitting points/600 dpi/4 gate-selecting lines by bonding wires. The anode terminals $A_1, A_2, \ldots,$ and $A_{32}$ of the matrix array chip 730 are connected to the output terminals 501, 502, . . . , and 532 of the driver IC 600 by the bonding wires 65 respectively. The gate-selecting terminals $G_1, G_2, G_3,$ and $G_4$ are directly connected to bonding pads on a printed circuit board (not shown) by bonding wires. It is noted that the reference numeral 62 denotes a part of the circuit as shown in FIG. 12.

Embodiment 7

The gate-selecting terminals $G_1, G_2, G_3,$ and $G_4$ of the light-emitting thyristor matrix array chip 730 are connected to the bonding pads on the printed circuit board, and the anode terminals $A_1, A_2, A_3, \ldots,$ and $A_{32}$ are connected to the bonding pads on the driver IC in the embodiment 6 described above. In such a case, a bonding process is difficult because the height of the printed circuit board is different from that of the driver IC.

Figure 14:
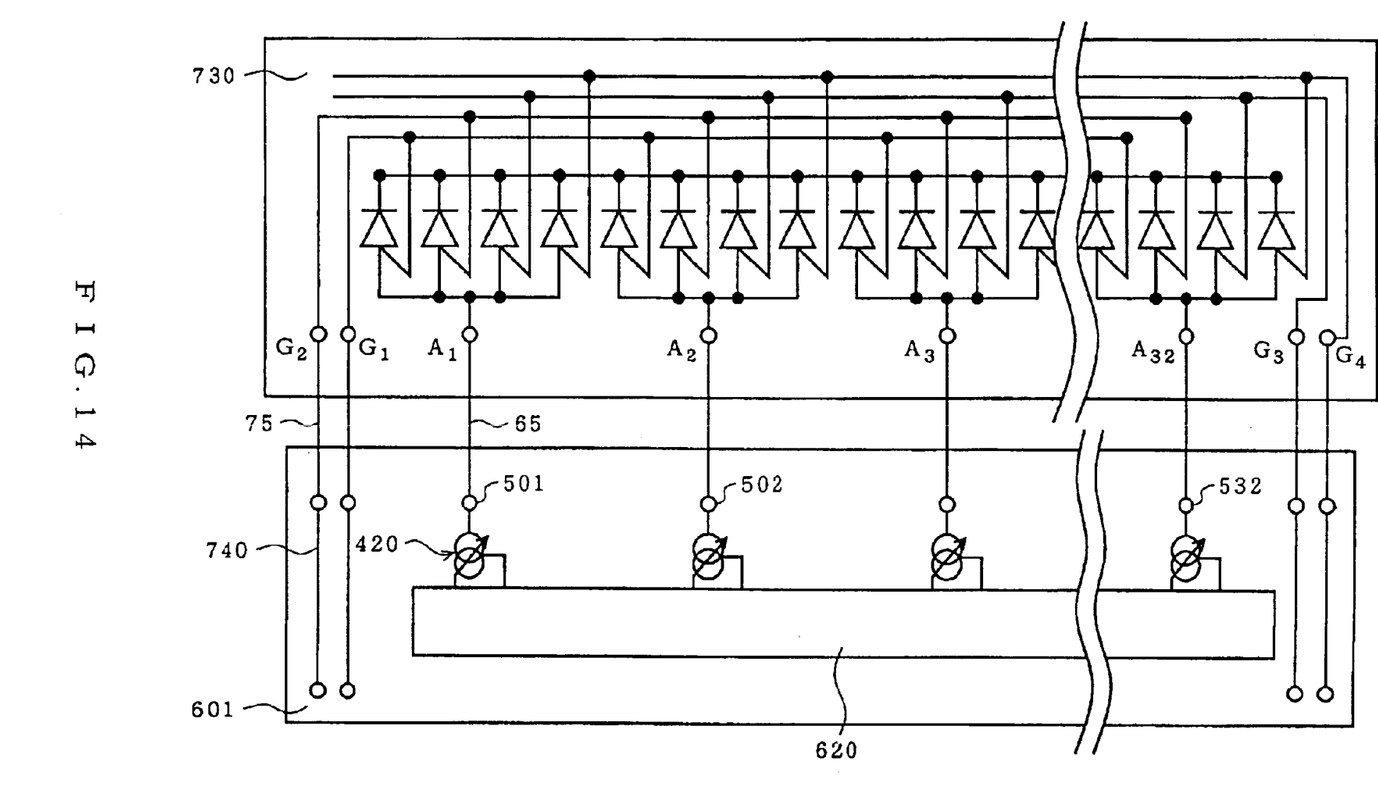
FIG. 14 is a diagram illustrating another example of connection between the light-emitting thyristor matrix array of 128 light-emitting points/600 dpi/4 gate-selecting lines and the driver IC by bonding wires.

In order to avoid this, lines 740 for passing the gate-selecting lines are provided on the driver IC 601 according to the present embodiment. The gate-selecting terminals $G_1, G_2, G_3,$ and $G_4$ are connected to the lines 740 by bonding wires 75, respectively.

Embodiment 8

Figure 15:
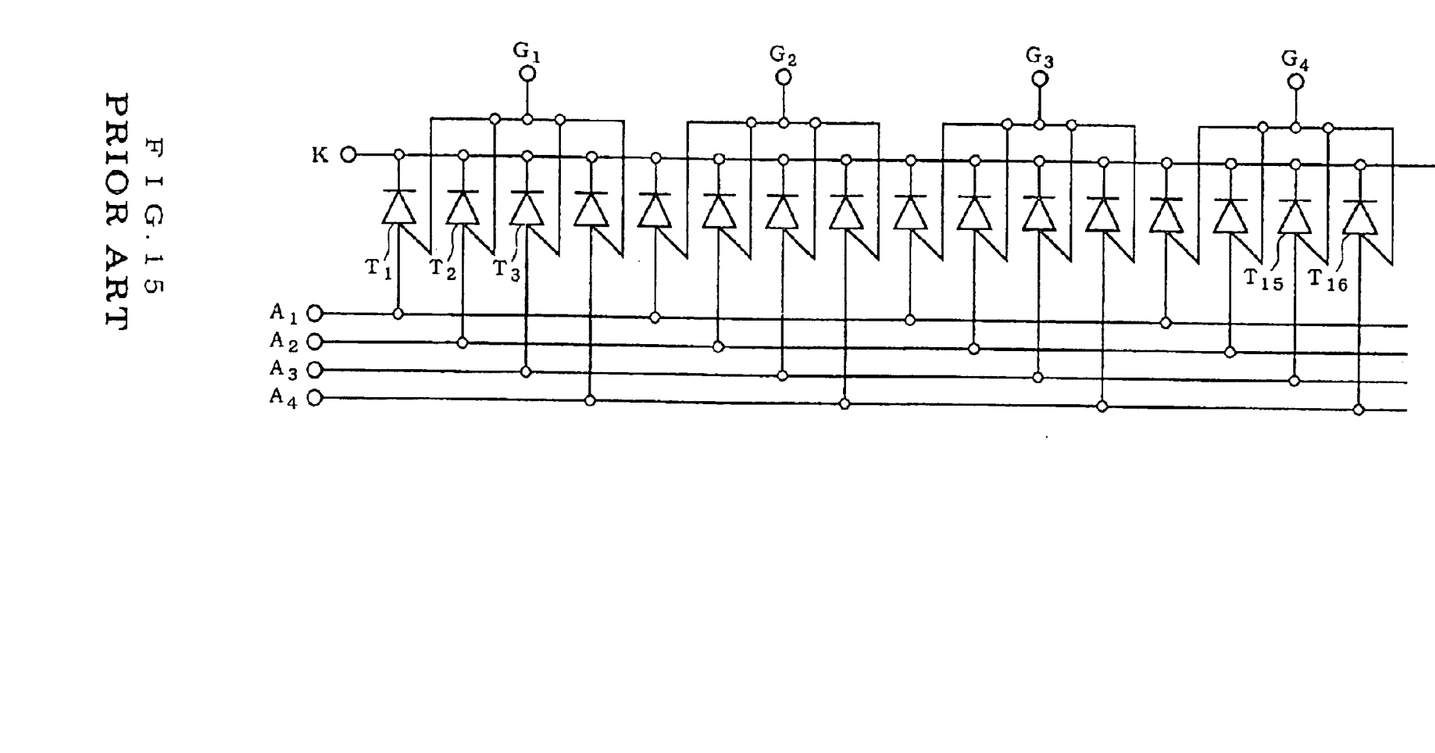
FIG. 15 is a diagram illustrating another example of a conventional light-emitting thyristor matrix array.

In the embodiments 1–7 described above, the light-emitting thyristor matrix array shown in FIG. 1 is used. While the gates of the thyristors are connected to selecting lines in the light-emitting thyristor matrix array of FIG. 1, the anodes may be connected to selecting lines. FIG. 15 shows the light-emitting thyristor matrix array in which the anodes are connected to selecting lines.

Gates of thyristors in each group are commonly connected to gate terminals $G_1, G_2, G_3, \ldots,$ respectively, anodes of thyristors in each group are separately connected to anode-selecting lines $A_1$–$A_4$, and cathodes of all the thyristor are commonly connected to a cathode line K.

In this light-emitting thyristor matrix array, when the cathode line K is at L level and an anode-selecting line $A_i$ is at H level while one gate terminal $G_j$ being at L level and the others H level, a light-emitting thyristors $T_{j+4(i-1)}$ is lighted up.

In comparison with the structure of FIG. 1, the number of anode terminals is reduced, so that the structure of a driver circuit becomes simple because the number of buffer circuit having a large current capacity is decreased.

While the cathode of the light-emitting thyristors are commonly connected in all the embodiment described hereinbefore, the structure in which the anodes of the thyristor are commonly connected is common is possible.

INDUSTRIAL APPLICABILITY

According to the present invention, the light-emitting thyristor matrix array in which the area of a chip is small may be presented, and the driver circuit may be implemented which is commonly applicable to a plurality of light-emitting thyristor matrix array having different resolution.

What is claimed is:

1. A light-emitting thyristor matrix array formed on a chip comprising:

N (n is an integer$\geq 8$) three-terminal light-emitting thyristors "arrayed in and sequentially numbered along one line in parallel with a long side of the chip on a main surface thereof";

a common terminal to which cathodes or anodes of the "N three-terminal light-emitting thyristors" are connected;

M (M is an integer $\geq 2$) gate selecting lines; and

{(N/M)+M}bonding pads arrayed in one line in parallel with the long side of the chip, wherein the gate "to the $k^{th}$ three-terminal light-emitting thyristor" is connected to the ith [i={(k−1) MOD M}+1] gate-selecting line $G_i$, where "MOD" in an equation means modulo division, the anode or cathode which is not connected to the common terminal of the kth "three-terminal light-emitting thyristor is connected to the $j^{th}$" [j={(k−i)/M}+1] anode terminal $A_j$ or cathode terminal $K_j$, the number M of the gate-selecting lines is selected so as to satisfy the expression L/{(N/M)+M}>p (L is a length of the long side of the chip and p is the array pitch of the bonding pads) in order to decrease "the area of said main surface of the chip", and when a prime factor for N is 2 only, the number M of the gate-selecting lines is positive and is the smallest integer, next smaller integer, or third smaller integer that satisfies the expression L/{(N/M)+M}>p.

2. A light-emitting thyristor matrix array formed on a chip, comprising:

N (N is any even integer other than 6) three-terminal light-emitting thyristors "arrayed in and sequentially numbered along one line in parallel with a long side of the chip on a main surface thereof";

a common terminal to which cathodes or anodes of the "N three-terminal light-emitting thyristors" are connected;

M (M is an integer $\geq 2$) gate-selecting lines; and

{(N/M)+M} bonding pads arrayed in one line in parallel with the long side of the chip, wherein the gate "of the $k^{th}$ three-terminal light-emitting thyristor is connected to the $i^{th}$" [i={(k−1) MOD M}+1] gate-selecting line $G_i$, where "MOD" in an equation means modulo division, the anode or cathode which is not connected to the common terminal of the "$k^{th}$ three-terminal light-emitting thyristor is connected to the $j^{th}$" [j={(k−i)/M}+1] anode terminal $A_j$ or cathode terminal $K_j$, the number M of the gate-selecting lines is selected so as to satisfy the expression L/{(N/M)+M}>p (L is a length of the long side of the chip and p is the array pitch of the bonding pads) in order to decrease "the area of said main surface of the chip"; and when prime factors for N are 2 and 3 only, the number M of the gate-selecting lines is positive and is the smallest integer, next smaller integer, third smaller integer, fourth smaller integer, or fifth smaller integer that satisfies the expression L/{(N/M)+M}>p.

3. A light-emitting thyristor matrix array formed on a chip, comprising:

N (N is an integer $\geq 8$) three-terminal light-emitting thyristors "arrayed in and sequentially numbered along one line in parallel with a long side of the chip on a main surface thereof";

a common terminal to which cathodes or anodes of the "N three-terminal light-emitting thyristors" are connected;

M (M is an integer $\geq 2$) anode-selecting lines or cathode-selecting lines; and {(N/M)+M} bonding pads arrayed in one line in parallel with the long side of the chip, wherein the anode or cathode "of the $k^{th}$ three-terminal light-emitting thyristor is connected to the $i^{th}$" [i={(k−1) MOD M}+1] anode-selecting line $A_i$ or cathode-selecting line $K_i$, where "MOD" in an equation means modulo division, the gate "of the $k^{th}$ three-terminal light-emitting thyristor is connected to the $j^{th}$" [j={(k−i)/M}+1] gate terminal $G_j$, the number M of the anode-selecting lines or cathode-selecting lines is selected to satisfy the expression L/{(N/M)+M}>p (L is a length of the long side of the chip and p is the array pitch of the bonding pads) in order to decrease "the area of said main surface of the chip", and when a prime factor for N is 2 only, M is positive and is the smallest integer, next smaller integer, or third smaller integer that satisfies the expression L/{(N/M)+M}>p.

4. A light-emitting thyristor matrix array formed on a chip, comprising:

N (N is any even integer $\geq$ other than 6) three-terminal light-emitting thyristors "arrayed in and sequentially numbered along one line in parallel with a long side of the chip on a main surface thereof";

a common terminal to which cathodes or anodes of the "N three-terminal light-emitting thyristors" are connected;

M (M is an integer $\geq 2$) anode-selecting lines or cathode-selecting lines; and {(N/M)+M} bonding pads arrayed in one line in parallel with the long side of the chip, wherein the anode or cathode "of the $k^{th}$ three-terminal light-emitting thyristor is connected to the $i^{th}$" [i={(k−1) MOD M}+1] anode-selecting line $A_i$ or cathode-selecting line $K_i$, where "MOD" in an equation means modulo division, the gate "of the $k^{th}$ three-terminal light-emitting thyristor is connected to the $j^{th}$" [j={(k−i)/M}+1] gate terminal $G_j$, the number M of the anode-selecting lines or cathode-selecting lines is selected to satisfy the expression L/{(N/M)+M}>p (L is a length of the long side of the chip and p is the array pitch of the bonding pads) in order to decrease "the area of said main surface of the chip", and when prime factors for N are 2 and 3 only, M is positive and is the smallest integer, next smaller integer, third smaller integer, fourth smaller integer, or fifth smaller integer that satisfies the expression L/{(N/M)+M}>p.

5. A driver circuit for driving the light-emitting thyristor matrix array according to any one of claims 1 or 2, comprising:

a circuit for driving the gate-selecting lines; and a circuit for driving the anode terminals or cathode terminals;

wherein the circuit for driving the gate-selecting lines includes an even number of gate-selecting signal output terminals and a circuit for outputting a "selecting" signal to one of the gate-selecting signal output terminals and "no-selecting" signal to the others of the gate-selecting signal output terminals, with the terminal to which the "selecting" signal is supplied being switched in turn.

6. The driver circuit of claim 5, wherein a serial input/parallel output shift register is used for the circuit for driving the gate-selecting lines.

7. The driver circuit of claim 6, wherein the number of the gate-selecting signal terminals is any one of 4, 6, 8, 12 and 16.

* * * * *

UNITED STATES PATENT AND TRADEMARK OFFICE
CERTIFICATE OF CORRECTION

PATENT NO.   : 6,717,183 B2
DATED         : April 6, 2004
INVENTOR(S)  : Seiji Ohno and Yukihisa Kusuda It is certified that error appears in the above-identified patent and that said Letters Patent is hereby corrected as shown below:

Column 8,
Line 64, "N (n" should read -- N (N --.

Column 9,
Line 7, "ith" should read -- $i^{th}$ --.
Line 11, "kth" should read -- $k^{th}$ --.

Column 10,
Line 18, "N (N is any even integer $\geq$ other than 6)" should read -- N (N is any even integer other than 6) --.

Signed and Sealed this

Twenty-third Day of November, 2004

JON W. DUDAS
*Director of the United States Patent and Trademark Office*